United States Patent
Koester et al.

(10) Patent No.: US 7,183,175 B2
(45) Date of Patent: Feb. 27, 2007

(54) SHALLOW TRENCH ISOLATION STRUCTURE FOR STRAINED SI ON SIGE

(75) Inventors: Steven John Koester, Ossining, NY (US); Klaus Dietrich Beyer, Poughkeepsie, NY (US); Michael John Hargrove, Clinton Corners, NY (US); Kern Rim, Yorktown Heights, NY (US); Kevin Kok Chan, Staten Island, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/172,707

(22) Filed: Jul. 1, 2005

(65) Prior Publication Data

US 2005/0260825 A1 Nov. 24, 2005

Related U.S. Application Data

(62) Division of application No. 10/374,866, filed on Feb. 25, 2003, now abandoned.

(51) Int. Cl.
*H01L 21/762* (2006.01)

(52) U.S. Cl. ............... 438/429; 438/435; 257/E21.546

(58) Field of Classification Search ............... 438/424, 438/429, 430, 431, 432
See application file for complete search history.

(56) References Cited

U.S. PATENT DOCUMENTS

| | | | |
|---|---|---|---|
| 5,212,110 A | 5/1993 | Pfiester | 438/222 |
| 5,266,813 A | 11/1993 | Comfort | 257/19 |
| 5,308,785 A | 5/1994 | Comfort | 438/429 |
| 6,150,212 A | 11/2000 | Divakaruni | 438/244 |
| 6,482,715 B2 | 11/2002 | Park | 438/424 |
| 6,706,581 B1 | 3/2004 | Hou | 438/216 |
| 6,727,553 B2 | 4/2004 | Kotani | 257/351 |
| 6,730,576 B1 | 5/2004 | Wang | 438/413 |
| 6,730,980 B2 | 5/2004 | Rhodes | 257/466 |
| 2003/0013305 A1 | 1/2003 | Sugü | 438/689 |
| 2004/0009636 A1 | 1/2004 | Ichinose | 438/296 |

*Primary Examiner*—Stephen W. Smoot
(74) *Attorney, Agent, or Firm*—George Sai-Halasz; Robert M. Trepp

(57) ABSTRACT

A structure, and a method for fabricating the structure, for the isolation of electronic devices is disclosed. The electronic devices are processed in substrates comprising a SiGe based layer underneath a strained Si layer. The isolation structure comprises a trench extending downward from the substrate top surface and penetrating into the SiGe based layer, forming a sidewall in the substrate. An epitaxial Si liner is selectively deposited onto the trench sidewall, and subsequently thermally oxidized. The trench is filled with a trench dielectric, which protrudes above the substrate top surface.

12 Claims, 5 Drawing Sheets

SHALLOW TRENCH ISOLATION STRUCTURE FOR STRAINED SI ON SIGE

CROSS REFERENCE TO A RELATED APPLICATION

This application is a division of application Ser. No. 10/374,866, filed Feb. 25, 2003 now abandoned, which is incorporated herein by reference.

FIELD OF THE INVENTION

The present invention relates to the field of semiconductor devices in general. In particular, the invention relates to a shallow trench isolation structure, and method for fabricating such a structure, for MOSFET devices processed on substrates which comprise SiGe based material layers.

BACKGROUND OF THE INVENTION

Today's integrated circuits include a vast number of devices. Smaller devices are key to enhance performance and to improve reliability. As MOSFET (Metal Oxide Semiconductor Field-Effect-Transistor, a name with historic connotations meaning in general an insulated gate Field-Effect-Transistor) devices are being scaled down, however, the technology becomes more complex and changes in device structures and new fabrication methods are needed to maintain the expected performance enhancement from one generation of devices to the next. In this regard the semiconductor that has progressed the farthest is the primary semiconducting material of microelectronics: silicon (Si).

There is great difficulty in maintaining performance improvements in devices of deeply submicron generations. Several avenues are being explored for keeping device performance improvements on track. Among these is the use of tensilely strained Si as the basic semiconducting device material. The strained Si layer is typically formed by growing Si epitaxially over a relaxed graded SiGe (Ge stands for germanium) based layer as discussed in Materials Science and Engineering Reports R17, 105 (1996), by P. M. Mooney, and in U.S. Pat. No. 5,659,187 to LeGoues et al. titled: "Low Defect Density/arbitrary Lattice Constant Heteroepitaxial Layers" incorporated herein by reference. For instance, a heterostructure consisting of relaxed $Si_{0.7}Ge_{0.3}$ capped with a thin (20 nm) strained Si layer has electron and hole mobilities over 80% higher than bulk Si. The higher mobility leads to faster switching speed, higher "on" current, and lower power dissipation. A MOSFET fabricated in tensile strained Si exhibits higher carrier mobilities than conventional MOSFET as it was shown for instance by K. Rim, et al. in "Enhanced performance in surface channel strained Si n and p MOSFETs", Proceedings of the Twenty Sixth International Symposium on Compound Semiconductors Berlin, Germany 22–26 Aug. 1999. Fabrication of a tensilely strained Si layer is also taught in U.S. patent application titled: "Strained Si based layer made by UHV-CVD, and Devices Therein", by J. Chu et al, filed Feb. 11, 2002, Ser. No. 10/073,562, incorporated herein by reference.

Innovations solving a problem, such as using SiGe as substrate material, often lead to unexpected complications. Such an unexpected difficulty arises in isolating devices when the substrate contains Ge. The two main device isolation schemes currently used in VLSI CMOS fabrication, local-oxidation of silicon (LOCOS) and shallow trench isolation (STI), both involve thermal oxidation of the substrate. However, thermal oxidation of SiGe based materials at high temperatures results in a high interface-state density, and defects caused by "snowplowing" of Ge. Therefore oxidation of SiGe based materials must be avoided in any isolation scheme.

A possible solution to this problem would be to implement an STI process without a grown oxide liner. However, the oxide liner is a very important part of the isolation process. It serves to round the top corners of the trench, preventing high-field regions from forming between a polysilicon over layer and the substrate. The grown oxide liner also reduces the density of interface states at the STI edges that can cause carrier depletion in these regions. The liner also can prevent dopant diffusion into the STI trench, particularly if it is grown in the presence of nitrogen to form an oxy-nitride layer. Finally, the liner reduces stress and prevents defect injection into the substrate upon subsequent thermal processing. Therefore, without the grown liner oxide, an STI process would be difficult to implement in a manufacturing environment.

Recognizing the problem, structures and methods were invented to avoid the oxidizing of Ge. One scheme consists of: a trench etched into a SiGe-containing substrate where the sidewalls of the trench are covered by a Si liner; a grown or deposited $SiO_2$ passivation layer; and an insulating material that fills the trench, and which is also planar with the wafer surface. The benefit of this structure is that it avoids thermal oxidation of SiGe on the walls of an etched trench by using a silicon liner that has vastly superior passivation properties compared to SiGe. This STI isolation scheme is described in U.S. Pat. Nos. 5,266,813 and 5,308,785 to Comfort et al. both titled: "Isolation technique for silicon germanium devices" and both incorporated herein by reference.

However, the use of this prior art has significant drawbacks. The isolation structure is planar with the substrate top surface, when it would be desirable to have the insulating layer protrude above the surface to prevent non-uniform oxidation of the exposed Si liner, and to offset recessing of the isolation layers that can occur during subsequent processing. The thermal oxidation of the Si liner may be slower at the edge, possibly leading to enhanced breakdown of the gate oxide. This problem would be exacerbated if the dielectric in the trench were accidentally recessed, exposing the corner of the trench liner before growth of the gate oxide. If one tried to correct for the planarity of the isolation structure and attempt to make it to protrude out of the substrate top surface, then having the Si liner surrounding high up the protruding isolation can cause severe device problems. The problem is that the Si liner on the surface of the isolation structure is in a polycrystalline state, which is notoriously unsuitable for high performance devices. In a MOSFET geometry, the polysilicon on the surface of the protruding insolation would also extend continuously from the source to the drain at the edge of the device, and could cause leakage between source and drain. In this prior art there is no suggestion how one could overcome the discussed difficulties.

SUMMARY OF THE INVENTION

In view of the discussed problems, this invention discloses a structure, and a method of fabricating the same, which serves the isolation purposes without such problems. This result is obtained by using a key processing step, namely the selective epitaxial growth of the Si liner. Selective growth means that the Si deposits on the exposed crystalline Si or SiGe surfaces, but does not deposit on any other surface. Such selective epitaxial deposition techniques are widely practiced in the electronics processing arts. In this manner one can form a high-quality passivation layer, thereby eliminating problems associated with the oxidation of SiGe, and at the same time avoiding problems associated with an exposed polycrystalline Si layer on the protruding isolation structure.

It is the object of the present invention to have an isolation that structure does not lead to device leakage or gate oxide breakdown.

It is also an object of the present invention to teach a process for forming the isolation region that eliminates the requirement for precise planarization, and allows for flexibility in tailoring the height of the isolation region.

It is a further object of the present invention to teach the structure of a shallow-trench isolation with an Si liner formed by selective growth and subsequent oxidation of Si in the trench.

It is yet a further object of the present invention to teach devices, circuits, and processors fabricated with the invented isolation scheme.

BRIEF DESCRIPTION OF THE DRAWINGS

These and other features of the present invention will become apparent from the accompanying detailed description and drawings, wherein.

DETAILED DESCRIPTION OF THE INVENTION

Figure 1A:
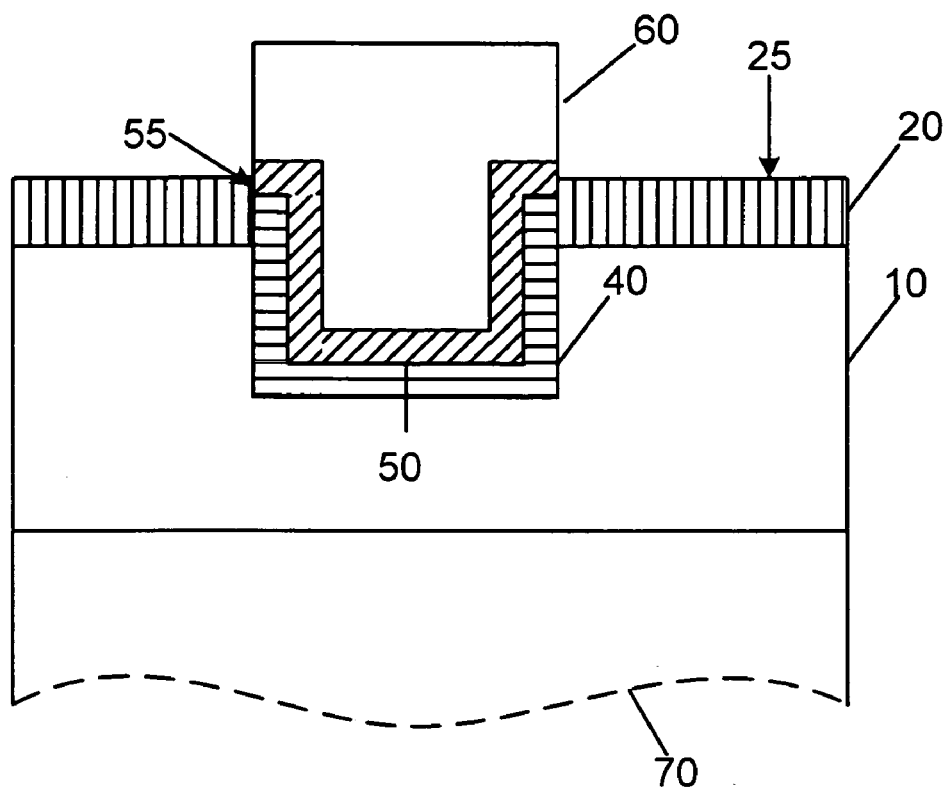
FIG. 1 shows schematic cross sectional views of embodiments of the isolation structure.
Figure 1B:
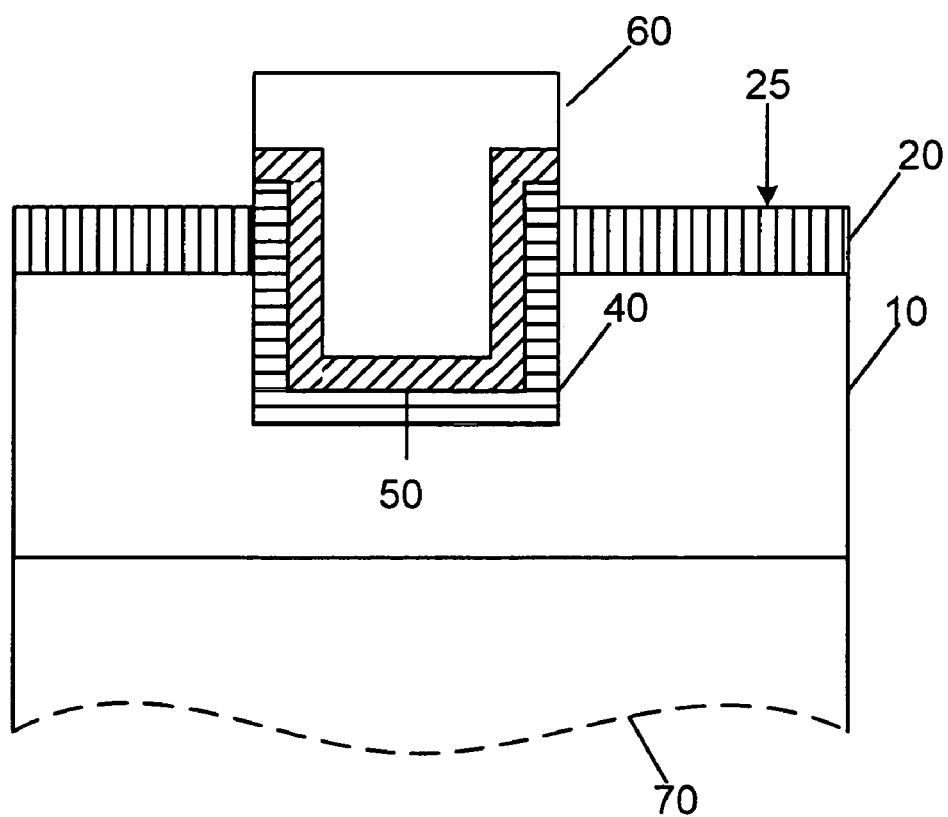

FIG. 1 shows a schematic of embodiments of the isolation structure. FIG. 1A shows an embodiment where the Si liner does not reach up to the top of the surface of the wafer. FIG. 1B shows an embodiment where the Si liner does reach up to the top of the surface of the wafer. The two variations of the embodiment depends on the relative thickness of the Si liner 40 and the isolator layer 50 grown on the Si liner. The two embodiments of FIG. 1A and FIG. 1B are equally preferred and acceptable solutions to the objects of the invention. In FIG. 1A, the embodiment comprises a SiGe based layer 10. Layer 10 is on top of a support structure 70, typically a Si wafer. The SiGe based layer is capped by a Si layer 20, typically in a tensilely strained state. The top surface of the substrate 25, in this case is also the top surface 25 of the tensilely strained Si layer 20. The support structure 70, the SiGe based layer 10, and the Si layer 20 together form the substrate. The substrate has a top surface 25, which in FIG. 1A and FIG. 1B is the top surface of the Si layer 20. A trench is extending downward from the top surface 25 penetrating into the SiGe based layer 10, and passing through the Si layer 20. The trench is filled with three materials: a Si liner 40, an oxide ($SiO_2$) or oxy-nitride insulator liner 50, and a oxide trench filling dielectric 60. The trench filling dielectric 60 protrudes over the top 25 of the substrate. This protrusion of the trench filling dielectric 60 is a significant aspect of the present invention. The sidewall of the trench, which is formed inside the substrate, is covered by the Si liner 40. The Si liner 40 covers all the surface of the SiGe based layer 10 which is on the trench sidewall. However, the Si liner 40 does not reach as high as the top edge of the trench, which edge is formed where the trench intersects the substrate top surface 25. The Si liner 40 leaves uncovered a strip shaped surface 55 on the sidewall, where the strip shaped surface 55 runs along the sidewall edge. Because of this strip 55 the Si liner 40 only partially covers the surface of the Si layer 20 which is on the trench sidewall. In FIG. 1A the Si liner 40 does not break out to the top surface 25 anywhere. FIG. 1B is exactly as FIG. 1A with the exception that the Si liner 40 reaches higher than the substrate top surface 25. This can happen because even for the case of selective epitaxy the thickness of the Si liner causes growth on the trench sidewall which reaches over the top surface 25. However, the Si liner 40 is a monocrystalline material in its entirety, with no polycrystalline material composition. Thus the problems in device fabrication due to polycrystalline Si reaching beyond the top surface 25 are avoided because now the Si liner 40 does not cause gate oxide or source-to-drain leakage. Since the embodiments of FIG. 1A and FIG. 1B are equally preferred and acceptable solutions to the objects of the invention in further figures only the embodiment where the Si liner 40 does not reach the top surface 25 will be shown. However, one skilled in the art would notice that where Si liner 40 reaches above the top surface of the substrate 25 is an equally acceptable embodiment.

The invention assures that by using a Si liner 40, Si is oxidized and not the sidewall surface of the SiGe based layer 10, eliminating the Ge "snowplowing" effect. Furthermore, the Si liner 40 is a monocrystalline material in an epitaxial relationship with the sidewall, therefore enabling a high-quality oxide and good $Si/SiO_2$ interface quality to be obtained.

The SiGe based layers are known in the art and can have a wide variety of compositions. Their purpose is to strain the overlaying Si layer, while maintaining a "device quality" material for the overlaying Si layer. The fabrication of such layers is described, for instance, in U.S. patent application Ser. No. 10/073,562, "Strained Si based layer made by UHV-CVD, and Devices Therein", by J. Chu et al, filed Feb. 11, 2002, The composition of the SiGe based layer is typically SiGe, SiGeC, or even pure Ge, or a multi-layer structure consisting of one or more of the preceding list.

Dimensions of various layer thicknesses can vary significantly depending, for instance, on the type of circuits that are involved in the applications. Device technology with time is becoming more advanced along the general tendency of shrinking dimensions. Dimension values given here should not be read as restrictive, as one skilled in the art would recognize that several other dimensional variations might be possible, all the while maintaining the scope of the present invention. The Si liner 40 in the trench is between about 1 nm and 50 nm thick; the strained Si layer 20 forming the top surface is between about 1 nm and 50 nm thick.; the SiGe based layer is between about 5 nm and 5 μm thick.; the insulator layer 50 grown on the Si liner 40 is between about 1 nm and 100 nm thick; the strip shaped surface on the sidewall below the edge of the top surface of the substrate, left uncovered by the Si liner 40, is between about 1 nm and 50 nm wide; the trench dielectric 60 protrudes above the top surface of the substrate by about between 1 nm and 500 nm; the trench itself reaches a depth relative to the top surface of the substrate of about between 2 nm and 1 μm.

Figure 2:
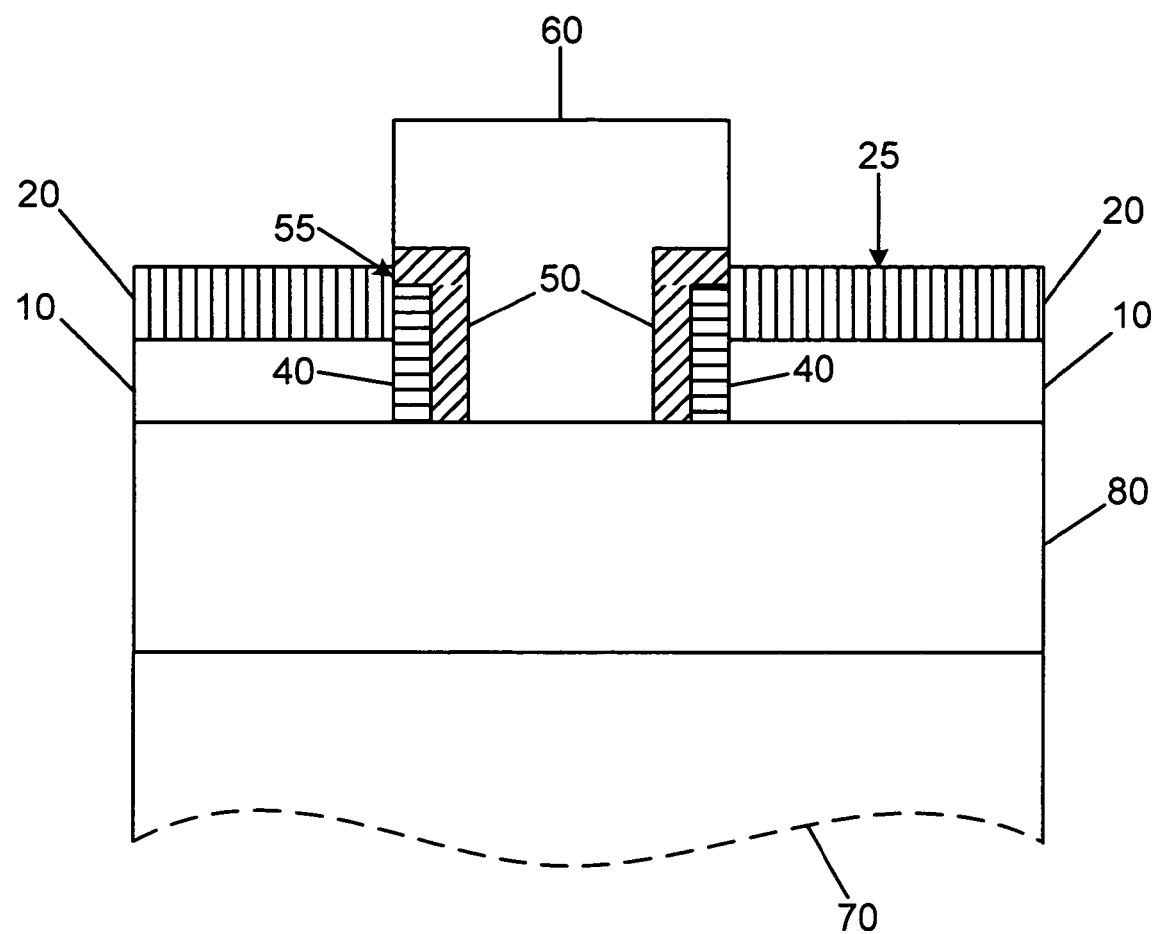
FIG. 2 shows a schematic cross sectional view of the isolation structure over a substrate comprising a buried insulator layer.

FIG. 2 shows a schematic cross sectional view of the isolation structure over a substrate further comprising a buried insulator layer 80. Here, the substrate comprises the buried insulator layer 80 between the support 70, typically Si, and the SiGe based layer 10. The buried insulator layer 80 is typically $SiO_2$. The isolation structure is essentially the same as on bulk of FIG. 1, except that as the result of the selective deposition of the Si liner 40, the Si liner 40, and therefore the thermal $SiO_2$ layer 50, are not found over the buried insulator layer 80.

Figure 3:
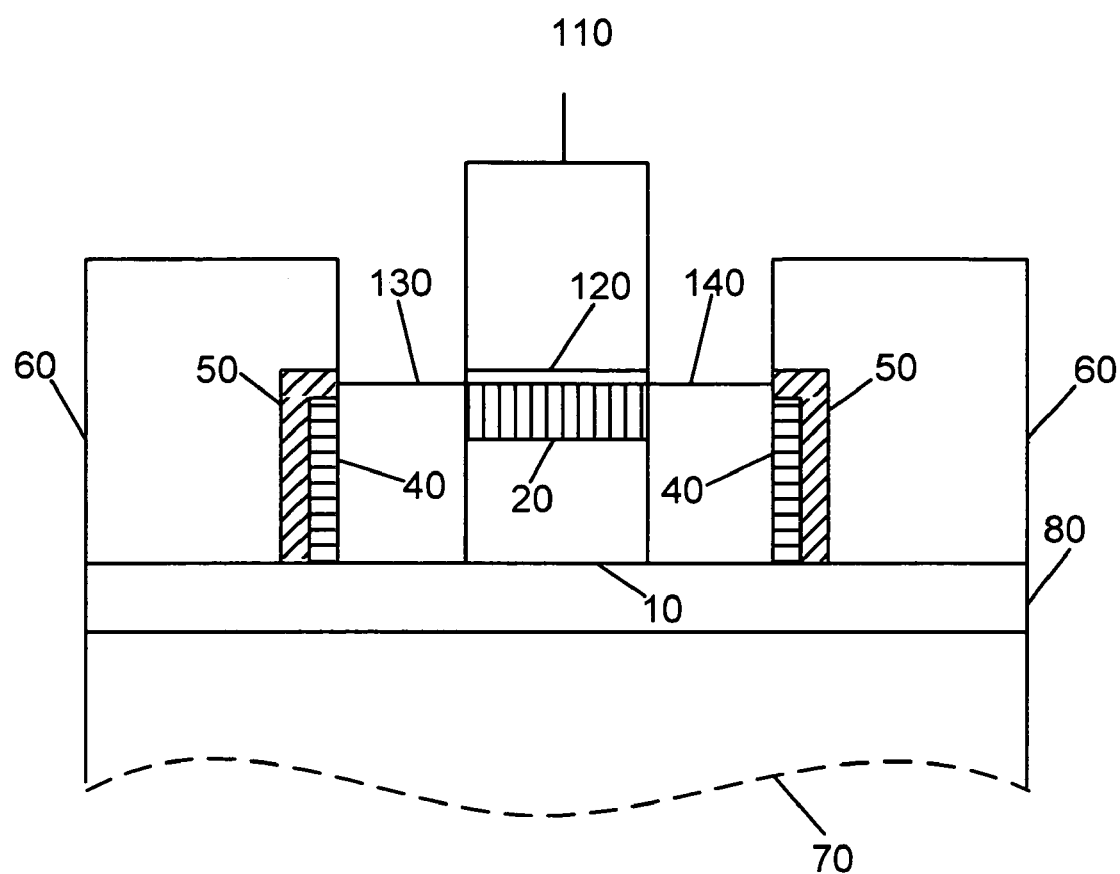
FIG. 3 shows a schematic cross sectional view of the of a MOSFET transistor utilizing the isolation scheme of the invention.

FIG. 3 shows a schematic cross sectional view of the of a MOSFET transistor utilizing the isolation scheme of the invention. The MOSFET comprises a gate electrode 1 10, separated from the strained Si layer 20 by an insulating gate dielectric 120, which is typically $SiO_2$. On either side of the gate 110 the source and drain regions 130 and 140 are implemented. In FIG. 3, as shown, it is not significant on which side of the gate is the source 130, and on which side is the drain 140. The remaining Si, left over from the Si liner 40 after the thermal oxidation, is doped the same type as the source and drain regions and therefore becomes part of the source and drain regions 130 and 140. This was made possible by the fact that the Si liner 40 is a monocrystalline material due to its selective deposition. The entire source/drain and gate regions are surrounded by the thermally-grown $SiO_2$ layer 50, and the trench filling dielectric 60. The MOSFET of FIG. 3 utilizes a buried $SiO_2$ layer 80. One skilled in the art would notice that a similar device implementation could utilize a bulk substrate and isolation scheme shown in FIG. 1. A plurality of MOSFET devices shown schematically on FIG. 3 can form the basis of any system in need of MOSFET devices. In particular, for the case of digital processors such MOSFETs are typically wired into CMOS circuits, which then can form all the various logic circuits needed by the processors.

FIG. 4 depicts a process sequence for making the isolation structure of the invention. One skilled in the art would notice that only the salient features of the process of one embodiment are being presented. Many further steps, all known in the electronics processing arts, may be needed to completely fabricate the isolation structure. Thus the presented steps should not be read in a way that is in any manner limiting.

Figure 4A:
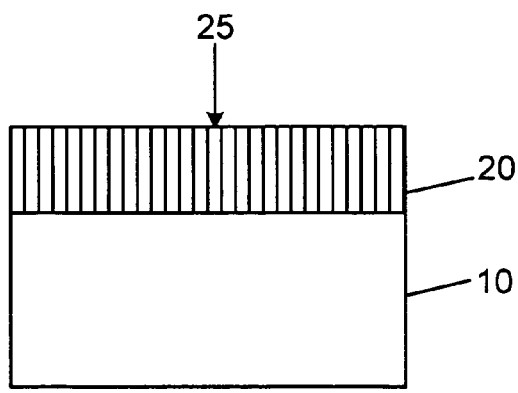
FIG. 4 depicts a process sequence for making the isolation structure of the invention.
Figure 4B:
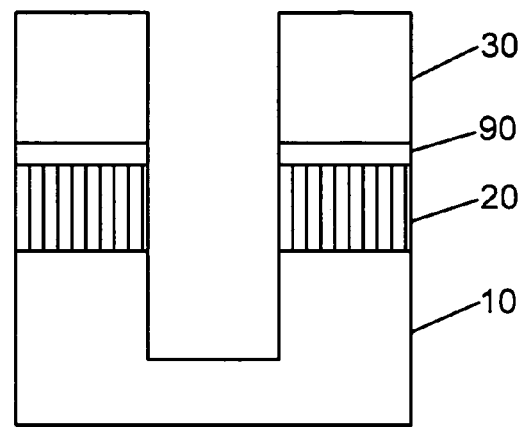
Figure 4C:
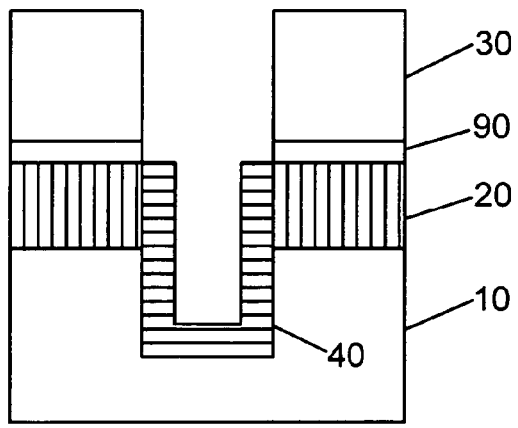
Figure 4D:
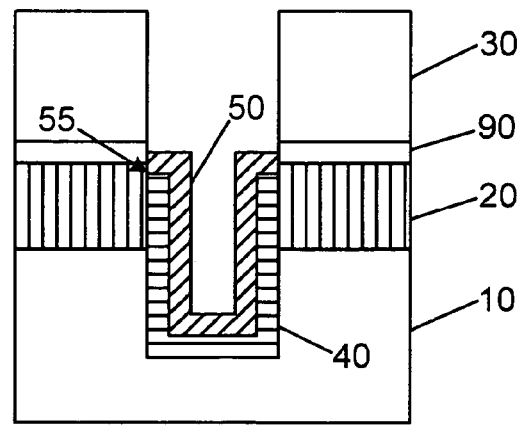
Figure 4E:
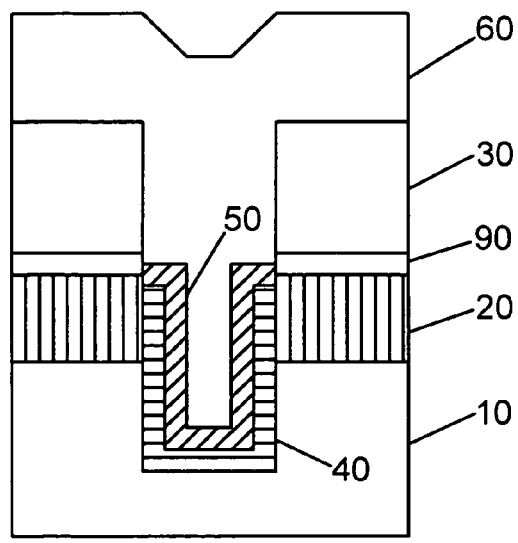
Figure 4F:
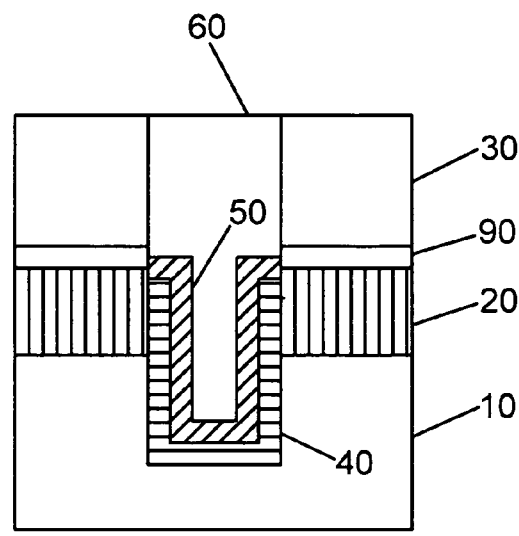
Figure 4G:
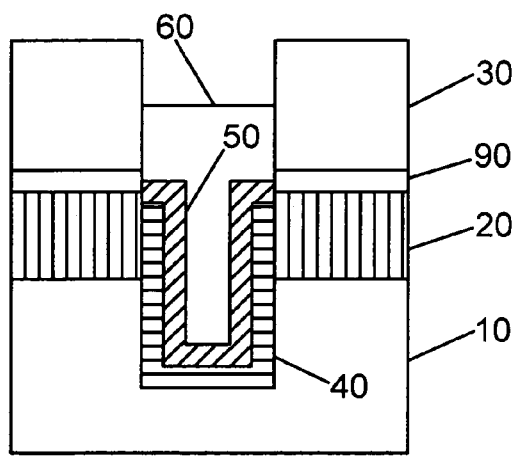
Figure 4H:
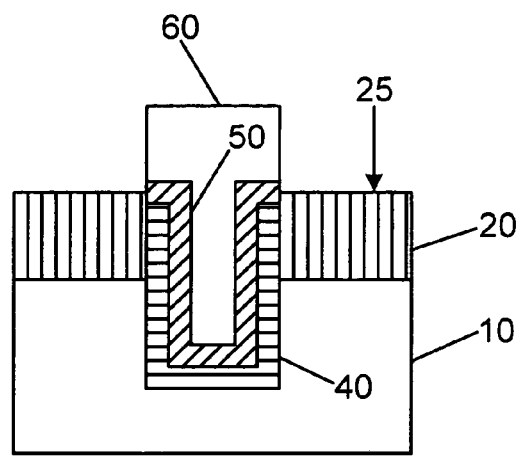

FIG. 4A shows the starting substrate comprising a relaxed SiGe based layer 10, with a strained Si layer 20 on top of it, and having a top surface 25, same as the substrate top surface. The top surface 25 is then overlaid with a capping dielectric layer 30, preferably silicon nitride to a thickness of between about 10 nm to 500 nm. This capping dielectric acts as a stopping layer for subsequent planarization steps. Optionally, a thin etch protection $SiO_2$ layer 90 can be placed underneath dielectric capping layer 30, to ensure that the substrate is not etched during the removal of layer 30. Then a trench is etched, with the trench cutting through the capping dielectric layer 30, and extending downward from the top surface of the substrate, which is the top surface of Si layer 20. The trench next penetrates into the SiGe based layer 10. In this manner the trench has an auxiliary sidewall formed in the capping dielectric layer 30, and has a sidewall formed in the substrate with crystalline layers 20 and 10. The trench has a sidewall edge formed where the sidewall intersects the top surface of layer 20. The result of these steps is shown in FIG. 4B. Next, as shown in FIG. 4C, a monocrystalline Si liner 40 is deposited by selective epitaxy over the sidewall, including a surface of the SiGe based layer 10 on the sidewall. The selective epitaxy leaves the auxiliary sidewall of the capping dielectric layer 30 void of the Si liner grown in the trench. Preferred methods of depositing the single-crystal liner are rapid-thermal chemical vapor deposition and ultra-high-vacuum chemical vapor deposition. These, and other such methods are widely practiced in the electronics processing arts. FIG. 4D depicts the state of the process after an insulator 50 is grown on the Si liner 40, partially consuming the Si liner 40. This consumption of the Si liner 40 is thinning the Si liner compared to as it was deposited on FIG. 4C. As shown in FIG. 4C and the following ones the insulator layer 50 removes the Si liner 40 in a strip shaped surface of the sidewall, where the strip 55 shaped surface runs along the sidewall edge. Here the Si liner does not reach up to the to surface 25 of the strained Si layer 20. The layer inside the trench which intersects the top surface of the substrate is the grown insulator 50. The thermally grown insulator 50 is typically a silicon-oxide or oxy-nitride. As shown in FIG. 1B, it is possible that the insulator 50 does not consume as much of the Si liner 40 that the liner would be below the top surface 25. Next, as shown in FIG. 4E, a trench dielectric 60 is blanket deposited in a thickness that the trench dielectric 60 overfills the trench, beyond the top of the capping dielectric layer 30. It is preferred that this trench dielectric consists essentially of $SiO_2$. As shown in FIG. 4F, the next step is to polish the trench dielectric layer 60 until the capping dielectric 30 and the trench dielectric 60 form one common surface. The capping dielectric 30 acts as a stopping layer for the polishing step. FIG. 4G shows the step where the trench dielectric 60 is selectively etched down to a protruding level which is above the top surface of the strained Si layer 20. This step is done typically by using a wet or dry selective etch. In this manner the trench is filled with a trench dielectric 60 to a protruding level which is above the substrate top surface. Finally as shown in FIG. 4H, the capping dielectric 30 is removed, whereby the trench dielectric 60 remains protruding out of the trench to above the top surface of the Si layer 20. The removal of the capping layer 30 is done selectively with respect to the underlying Si layer 20 and trench dielectric 60. If the optional thin $SiO_2$ layer 90 were used in the process, then it is removed after the removal of the capping dielectric 60. Layer 90 would serve in a protective role making sure that the strained Si layer 20 is not etched during the removal of the capping dielectric layer 30. With these etching steps the process is complete. The process illustrated in FIG. 4 was for an embodiment with a bulk substrate, but one skilled in the art would notice that the process would be essentially identical for a substrate comprising a buried oxide layer 80, as shown on FIG. 2.

Many modifications and variations of the present invention are possible in light of the above teachings, and could be apparent for those skilled in the art. The scope of the invention is defined by the appended claims.

We claim:

1. A method for making a device structure, comprising:
   taking a substrate comprising a SiGe based layer, said substrate having a top surface;
   overlaying said substrate with a capping dielectric layer;
   etching a trench, wherein said trench cutting through said capping dielectric layer and extending downward from said top surface and penetrating into said SiGe based layer, and wherein said trench having an auxiliary sidewall formed in said capping dielectric layer and having a sidewall formed in said substrate;
   depositing by selective epitaxy a monocrystalline Si liner over said sidewall including a surface of said SiGe based layer on said sidewall, and leaving said auxiliary sidewall void of said Si liner.

2. The method for making a device structure of claim 1, further comprising:
   partially consuming said Si liner by growing an insulator on said Si liner;
   filling said trench with a trench dielectric to a protruded level which is above said top surface; and
   removing said capping dielectric, whereby said trench dielectric is protruding out of said trench into the open to above said top surface and to above said Si liner.

3. The method for making a device structure of claim 2, wherein said filling step further comprises:
   blanket depositing said trench dielectric to a thickness that said trench is overfilled;
   polishing said trench dielectric until said capping dielectric and said trench dielectric form one common surface; and
   selectively etching down said trench dielectric to said protruded level which is above said top surface.

4. The method for making a device structure of claim 2, wherein said partially consuming removes said Si liner in a strip shaped surface on said sidewall, wherein said strip shaped surface runs along a sidewall edge, wherein said trench having said sidewall edge formed where said sidewall intersects said top surface.

5. The method for making a device structure of claim 2, wherein said grown insulator on said Si liner is chosen to consist essentially of $SiO_2$.

6. The method for making a device structure of claim 2, wherein said trench dielectric is chosen to consist essentially of $SiO_2$.

7. The method for making a device structure of claim 1, wherein said substrate is chosen to comprise a Si layer on top of said SiGe based layer.

8. The method for making a device structure of claim 7, wherein said Si layer is chosen to be between about 1 nm and 50 nm thick.

9. The method for making a device structure of claim 8; wherein said Si layer is tensilely strained.

10. The method for making a device structure of claim 1, wherein in said overlaying step said capping dielectric is chosen to consist essentially of silicon-nitride.

11. The method for making a device structure of claim 1, wherein said grown insulator on said Si liner is chosen to consist essentially of silicon-oxynitride.

12. The method for making a device structure of claim 1, further comprising:
   depositing an etch protection $SiO_2$ layer on said substrate prior to said overlaying step.

* * * * *